(12) United States Patent
Chen et al.

(10) Patent No.: US 6,506,615 B2
(45) Date of Patent: Jan. 14, 2003

(54) METHOD FOR MEASURING THE DEPTH OF WELL

(75) Inventors: Jen-Te Chen, Hsinchu (TW); Kou-Liang Jaw, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 10/074,852

(22) Filed: Feb. 11, 2002

(65) Prior Publication Data

US 2002/0164831 A1 Nov. 7, 2002

(30) Foreign Application Priority Data

May 4, 2001 (TW) ........................................ 90110716 A

(51) Int. Cl.⁷ ............................................. H01L 21/66
(52) U.S. Cl. ............................. 438/14; 438/15; 438/16; 438/658; 438/255
(58) Field of Search ............................. 438/14, 15, 16, 438/255, 658; 250/307, 306

(56) References Cited

U.S. PATENT DOCUMENTS

| 6,110,777 A | * | 8/2000 | Lowrey et al. | 438/14 |
| 6,165,807 A | * | 12/2000 | Lee et al. | 438/14 |
| 6,313,480 B1 | * | 11/2001 | Zatelli et al. | 257/48 |
| 6,368,887 B1 | * | 4/2002 | Lowrey et al. | 438/14 |

\* cited by examiner

Primary Examiner—Richard Booth
Assistant Examiner—Olivia Luk
(74) Attorney, Agent, or Firm—Townsend and Townsend and Crew LLP

(57) ABSTRACT

The present invention is directed to an effective and relatively inexpensive way to measuring the depth of a well in a semiconductor device. In accordance with an aspect of the present invention, a method for measuring the depth of a well of a substrate comprises providing a substrate having a well therein and a cut through a depth of the well. The substrate is exposed to an etchant to reveal a discontinuity in a boundary at the depth of the well. The depth of the well is measured at the boundary by scanning electron microscopy (SEM) or other suitable techniques.

31 Claims, 4 Drawing Sheets

METHOD FOR MEASURING THE DEPTH OF WELL

CROSS-REFERENCES TO RELATED APPLICATIONS

This application claims priority from R.O.C. Patent Application No. 090110716, filed May 4, 2001, the entire disclosure of which is incorporated herein by reference.

BACKGROUND OF THE INVENTION

The present invention relates generally to semiconductor devices and, more particularly, to measuring the depth of a well in a semiconductor device or substrate.

The depth and shape of the boundary of a well affect the electrical properties of a power integrated circuit (IC), especially in $R_{ds\text{-}on}$, the threshold voltage, and the drain-to-source breakdown voltage. Thus, monitoring the depth and shape of the boundary of a well is an important task.

Traditionally, the spreading resistance probe (SRP) is used to simulate the depth of a well. A well-skilled operator is needed, however, to prepare the sample prior to measurement with the probe. Moreover, the use of the probe for well measurement is time-consuming and expensive. If the width of the device region is smaller than 50 μm, this method cannot be used.

In another technique, the secondary ion mass spectroscopy (SIMS) is used to analyze the distribution of dopants in the device. If the width of the device region is smaller than 100 μm, however, such a method cannot be used.

BRIEF SUMMARY OF THE INVENTION

The present invention is directed to an effective and relatively inexpensive way for measuring the depth of a well in a semiconductor device or substrate. In specific embodiments, the device having a well in a substrate is cut through the well, and different regions forming the well are selectively removed by an etchant to expose the boundary of the well. The depth of the well is measured by scanning electron microscopy (SEM) or other suitable techniques.

In accordance with an aspect of the present invention, a method for measuring the depth of a well of a substrate comprises providing a substrate having a well therein and a cut through a depth of the well. The substrate is exposed to an etchant to reveal a discontinuity in a boundary at the depth of the well. The depth of the well is measured at the boundary.

In some embodiments, the well is a p-type well and the substrate is an n-type substrate. In other embodiments, the well is an n-type well and the substrate is a p-type substrate. In some embodiments, the etchant may comprise nitric acid, hydrofluoric acid, saturated iodide, and deionized water. The iodide may be selected from the group consisting of potassium iodide (KI) and sodium iodide (NaI). In other embodiments, the etchant may comprise nitric acid, hydrofluoric acid, saturated iodine, and deionized water.

In specific embodiments, the substrate is dipped into the etchant to reveal the discontinuity in the boundary at the depth of the well. The etchant is at a temperature of about 20–30° C. The substrate is dipped in the etchant for about 10–50 seconds. The substrate is washed with deionized water after exposing the substrate to the etchant to reveal the discontinuity in the boundary at the depth of the well. The depth of the well may be measured by a scanning electron microscope.

Another aspect of the present invention is directed to a method for measuring a depth of a boundary between a first conducting doped region and a second conducting doped region. The method comprises using an etchant to selectively etch the first conducting doped region and the second conducting doped region to reveal a boundary therebetween. The etchant has a different selectivity between the first conducting doped region and the second conducting doped region. The method further comprises measuring the depth of the boundary between the first conducting doped region and the second conducting doped region.

In some embodiments, the boundary is a p-n boundary. The etch rate of the second conducting doped region is higher than the etch rate of the first conducting doped region. The first conducting doped region may be a p-doped region and the second conducting doped region may be an n-doped region.

Another aspect of the present invention is directed to a method for measuring the depth of a boundary between a first n-doped region with a first doped concentration and a second n-doped region with a second doped concentration which is different from the first doped concentration. The method comprises using an etchant to selectively etch the first n-doped region with the first doped concentration and the second n-doped region with the second doped concentration which is different from the first doped concentration to reveal a discontinuity at a boundary therebetween. The method further comprises measuring a depth of the boundary between the first n-doped region and the second n-doped region.

In accordance with another aspect of the present invention, an etchant having an etch rate of an n-doped region which is higher than an etch rate of a p-doped region comprises the following:

1 molar ratio of nitric acid;
0.01–0.05 molar ratio of hydrofluoric acid;
2 molar ratio of deionized water; and
0.001–0.003 molar ratio of iodide ions.

In some embodiments, the etchant has an etch rate of a first n-doped region having a first n-dopant concentration which is higher than an etch rate of a second n-doped region having a second n-dopant concentration, wherein the second n-dopant concentration is lower than the first n-dopant concentration.

In accordance with another aspect of the present invention, a method for measuring depths of boundaries comprises using an etchant to selectively etch a p-doped region, a first n-doped region having a first n-dopant concentration, and a second n-doped region having a second n-dopant concentration which is higher than the first n-dopant concentration, to reveal a first boundary between the p-doped region and the first n-doped region, and to reveal a second boundary between the first n-doped region and the second n-doped region. The etch rates are characterized as follows:

an etch rate of the second n-doped region>
an etch rate of the first n-doped region>
an etch rate of the p-doped region.

The method further comprises measuring a depth of the first boundary and a depth of the second boundary. The depths may be measured using a scanning electron microscope.

DETAILED DESCRIPTION OF THE INVENTION

Figure 1:
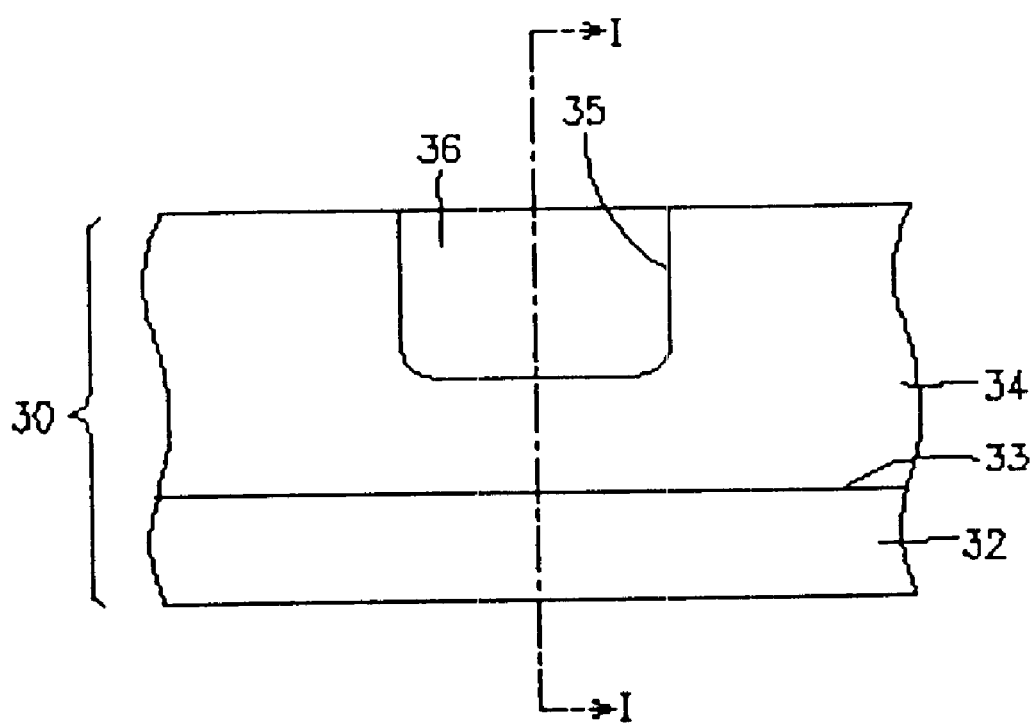
FIG. 1 is a cross-sectional schematic diagram of a substrate having a p-n boundary.

FIG. 1 is a cross-sectional schematic diagram of a device or substrate 30 with a p-n boundary. The substrate 30 is typically a silicon substrate, and includes a p-doped region (p well) 36 and n-doped regions 32, 34 with different concentrations of n dopants. In the embodiment shown, the concentration of the n-doped region 32 is higher than that of the n-doped region 34. A p-n boundary 35 is formed between the p-doped region 36 and the n-doped region 34. The n-doped region 32 and the n-doped region 34 are separated by a boundary 33.

Figure 2A:
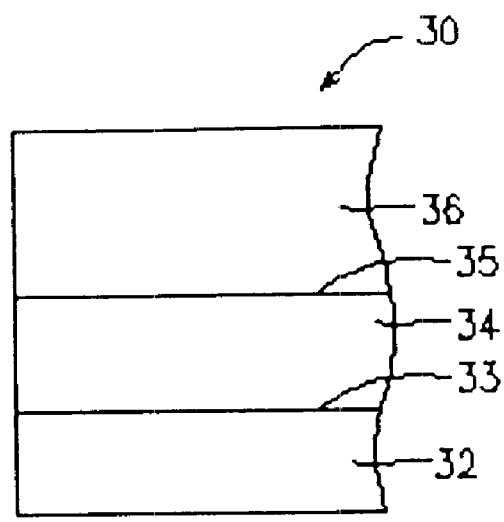
FIG. 2A is a cross-sectional schematic diagram of the right side of the cut substrate of FIG. 1 after cutting off the left side of the device along line I—I according to an embodiment of the present invention.
Figure 2B:
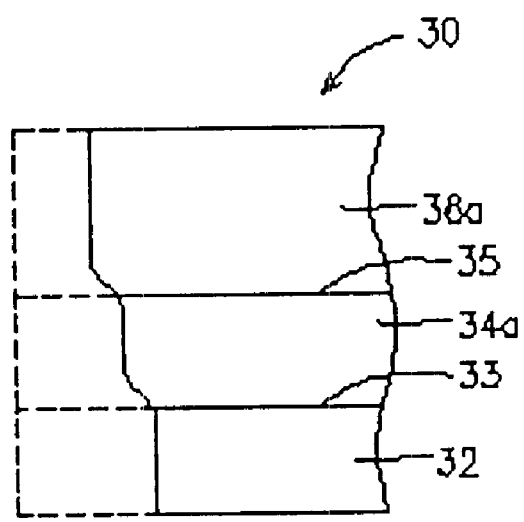
FIG. 2B is a cross-sectional schematic diagram of the right side of the cut substrate of FIG. 2A after etching according to an embodiment of the present invention.

The substrate 30 is cut along the line I—I. FIG. 2A shows the right side of the substrate 30 after the cut. The right side of the cut substrate 30 is dipped into an etchant to selectively remove the n-doped regions 32, 34 (by greater amounts than the p well 36) to reveal a discontinuity in the p-n boundary 35 between the p-doped region 36 and the n-doped region 34, as illustrated in FIG. 2B. The etchant has the characteristics that the etch rates of the n-doped regions 32, 34 are faster than the etch rate of the p-doped region 36. After achieving the desired etching, the depth and shape of the p-n boundary 35 in the treated substrate 30 can be measured using a scanning electron microscope (SEM) or other suitable techniques.

In the embodiment shown in FIGS. 1–2B, the etchant includes a selectivity ratio of n-doped region to p-doped region which is typically between about 1.3 and 1.8. A suitable etchant may comprise, for example nitric acid, hydrofluoric acid, iodine, and deionized water; or nitric acid, hydrofluoric acid, iodide, and deionized water. The iodide is saturated and can be, for example potassium iodide (KI) or sodium iodide (NaI). In a specific embodiment, the molar ratio of nitric acid to hydrofluoric acid to deionized water to iodide ion is about 1: (0.01–0.05): 2: (0.001–0.003). The temperature during etching is typically maintained at about 20–30° C. The processing time is typically about 10–50 seconds.

After selectively removing the n-doped regions 32, 34, the substrate is subjected to a wash with deionized water or the like to remove the residual of the etchant. The SEM is then used to measure the depth and shape of the boundary of the p well 36.

In the embodiment shown, the etchant has a high selectivity for the n-doped region to the p well in the silicon substrate, so that the n-doped region can be removed faster than the p well region to facilitate measurement of the depth of the p well. Moreover, this technique can be used to measure the depth of an n well. In that case, the etchant can be selected to have a high selectivity for the n well to the p-doped region in the substrate.

The etchant can also be used to reveal the boundary 33 between the n-doped regions 32, 34 which have different n dopant concentrations. This is possible because the etchant has a high etch rate for the n-doped region 32 with the higher concentration than for the n-doped region 34 with the lower concentration. After dipping the substrate 30 in the etchant, a discontinuity in the boundary 33 between the n-doped regions 32, 34 is revealed, as illustrated in FIG. 2B. The treated substrate 30 is washed with deionized water or the like, and the SEM is used to measure the depth of the boundary 33 between the n-doped regions 32, 34.

In a specific example, the difference in dosage between the n-doped regions 32, 34 is over 100 times.

The following describes the difference in the etch rate for an etchant that comprises nitric acid, hydrofluoric acid, iodine or iodide, and deionized water. The etch rate for the higher concentration n-doped region 32 is greater than the etch rate for the lower concentration n-doped region 34, which is greater than the etch rate for the p-doped region or p well 36. This is achieved because the reacting rates between iodide ions and p-dopants (such as B+) and between iodide ions and n-dopants (such as $P^+$) are different. The reacting rate of iodide ions and $P^+$ ions (n-dopants) is faster than the reacting rate of iodide ions and $B^+$ ions (p-dopants). If the concentration of $P^+$ ions increases, the reacting rate of iodide ions and $P^+$ ions increases. The etching rate of $B^+$ ions or $P^+$ ions reacting with iodide ions is relative to the oxidizing rate of the corresponding matrix silicon atoms. The silicon atoms oxidize to form silicon oxide, and the silicon oxide is removed by hydrofluoric acid.

Figure 3:
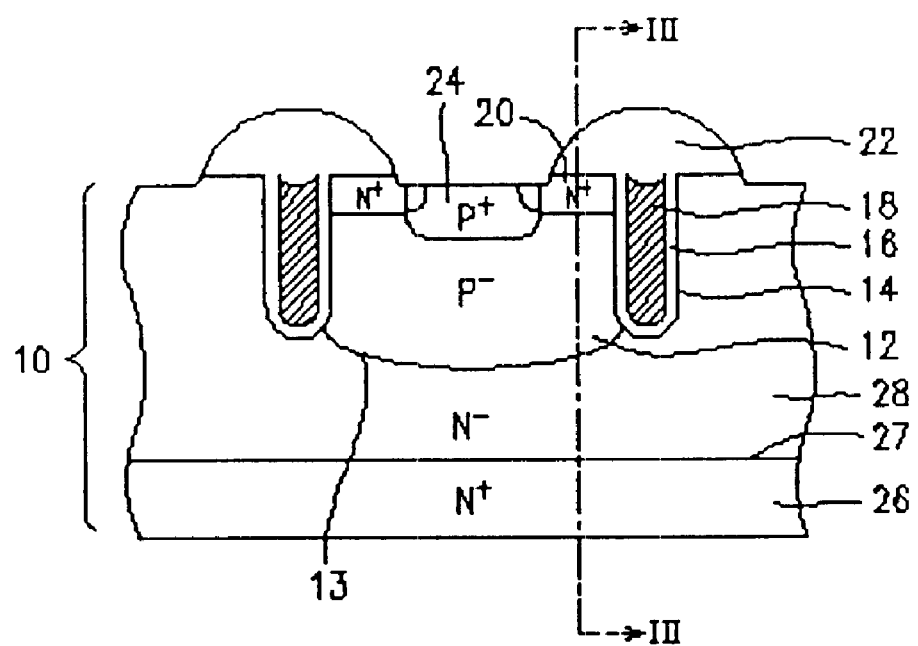
FIG. 3 is a cross-sectional schematic diagram of a power IC.
Figure 4A:
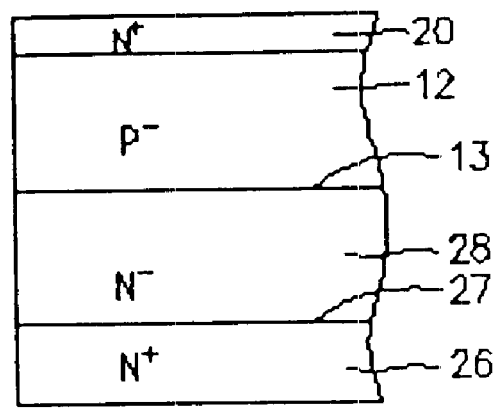
FIG. 4A is a cross-sectional schematic diagram of the right side of the cut substrate of FIG. 3 after cutting off the left side of the device along line III—III according to an embodiment of the present invention.
Figure 4B:
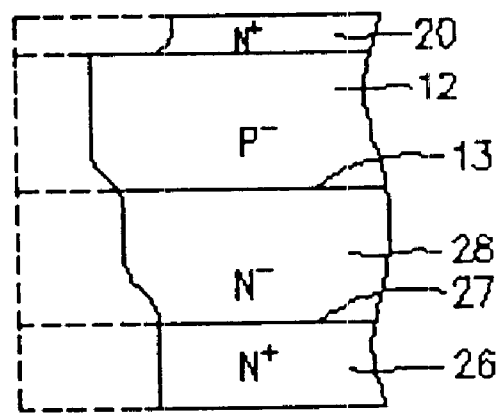
FIG. 4B is a cross-sectional schematic diagram of the right side of the cut substrate of FIG. 4A after etching according to an embodiment of the present invention.

The above-described method can be applied to measure the depth of a well in various devices or substrates. In one example, the method is employed to measure the depth of the p well of a power IC as illustrated in FIGS. 3–4B. FIG. 3 shows the cross-sectional schematic diagram of the power IC substrate 10, which includes an $n^+$ doped region 26, an $n^-$ doped region 28, and a $p^-$ well 12. In a specific embodiment, the $n^+$ doped region 26 has a dosage of about 1E18 $cm^{-2}$–1E19 $cm^{-2}$; the $n^-$ doped region 28 has a dosage of about 1E16 $cm^{-2}$–1E17 $cm^{-2}$; and the $p^-$ well 12 has a dosage of about 7E13 $cm^{-2}$. A p-n boundary 13 is formed between the $p^-$ well 12 and the $n^-$ doped region 28. The substrate 10 includes a trench 14, a gate oxide layer 16, a gate 18, an $n^+$ source 20, a BPSG layer 22, and a $p^+$ region 24. In a specific embodiment, the $n^+$ source 20 has a dosage of about 1E16 $cm^{-2}$; and the $p^+$ region 24 has a dosage of about 5E14 $cm^{-2}$.

In this example, the etchant comprises 18 ml of 70% nitric acid, 2.2 ml of 49% hydrofluoric acid, 2 ml of deionized water, and 0.2 g potassium iodide. The power IC substrate 10 is cut along the line III—III, as shown in FIG. 4A, and then subjected to a dip in the etchant for 25 seconds. The etched substrate 10 is washed with deionized water. This procedure reveals a discontinuity in the p-n boundary 13 in the substrate 10, as seen in FIG. 4B. In addition, it reveals a discontinuity in the boundary 27 between the $n^+$ doped region 26 with the higher concentration and the n doped region 28 with the lower concentration.

The above-described arrangements of apparatus and methods are merely illustrative of applications of the principles of this invention and many other embodiments and modifications may be made without departing from the spirit and scope of the invention as defined in the claims. The scope of the invention should, therefore, be determined not with reference to the above description, but instead should be determined with reference to the appended claims along with their full scope of equivalents.

What is claimed is:

1. A method for measuring the depth of a well of a substrate, the method comprising:
   providing a substrate having a well therein and a cut through a depth of the well;
   exposing the substrate to an etchant to reveal a discontinuity in a boundary at the depth of the well; and
   measuring the depth of the well at the boundary.

2. The method of claim 1 wherein the well is a p-type well and the substrate is an n-type substrate.

3. The method of claim 1 wherein the well is an n-type well and the substrate is a p-type substrate.

4. The method of claim 1 wherein the etchant comprises nitric acid, hydrofluoric acid, saturated iodide, and deionized water.

5. The method of claim 4 wherein the iodide is selected from the group consisting of potassium iodide (KI) and sodium iodide (NaI).

6. The method of claim 1 wherein the etchant comprises nitric acid, hydrofluoric acid, saturated iodine, and deionized water.

7. The method of claim 1 wherein the substrate is dipped into the etchant to reveal the discontinuity in the boundary at the depth of the well.

8. The method of claim 7 wherein the etchant is at a temperature of about 20–30° C.

9. The method of claim 7 wherein the substrate is dipped in the etchant for about 10–50 seconds.

10. The method of claim 1 further comprising washing the substrate with deionized water after exposing the substrate to the etchant to reveal the discontinuity in the boundary at the depth of the well.

11. The method of claim 1 wherein the depth of the well is measured by a scanning electron microscope.

12. A method for measuring a depth of a boundary between a first conducting doped region and a second conducting doped region, the method comprising:
   using an etchant to selectively etch the first conducting doped region and the second conducting doped region to reveal a boundary therebetween, the etchant having a different selectivity between the first conducting doped region and the second conducting doped region; and
   measuring the depth of the boundary between the first conducting doped region and the second conducting doped region.

13. The method of claim 12 wherein the boundary is a p-n boundary.

14. The method of claim 12 wherein an etch rate of the second conducting doped region is higher than an etch rate of the first conducting doped region.

15. The method of claim 12 further comprising washing the etched first conducting doped region and the etched second conducting doped region after using the etchant to selectively etch the first conducting doped region and the second conducting doped region.

16. The method of claim 12 wherein the first conducting doped region is a p-doped region and the second conducting doped region is an n-doped region.

17. The method of claim 12 wherein the etchant used to selectively etch the first conducting doped region and the second conducting doped region has a temperature of about 20–30° C.

18. The method of claim 12 wherein the etchant is used to selectively etch the first conducting doped region and the second conducting doped region for about 10–50 seconds.

19. The method of claim 12 wherein the etchant comprises nitric acid, hydrofluoric acid, saturated iodide, and deionized water.

20. The method of claim 19 wherein the iodide is selected from the group consisting of potassium iodide (KI) and sodium iodide (NaI).

21. The method of claim 12 wherein the etchant comprises nitric acid, hydrofluoric acid, saturated iodine, and deionized water.

22. The method of claim 12 wherein the depth of the well is measured using a scanning electron microscope.

23. A method for measuring the depth of a boundary between a first n-doped region with a first doped concentration and a second n-doped region with a second doped concentration which is different from the first doped concentration, the method comprising:
   using an etchant to selectively etch the first n-doped region with the first doped concentration and the second n-doped region with the second doped concentration which is different from the first doped concentration to reveal a discontinuity at a boundary therebetween; and
   measuring a depth of the boundary between the first n-doped region and the second n-doped region.

24. The method of claim 23 further comprising washing the etched first n-doped region and the etched second n-doped region after using the etchant to selectively etch the first n-doped region and the second n-doped region.

25. The method of claim 23 wherein the etchant used to selectively etch the first n-doped region and the second n-doped region has a temperature of about 20–30° C.

26. The method of claim 23 wherein the etchant is used to selectively etch the first n-doped region and the second n-doped region for about 10–50 seconds.

27. The method of claim 23 wherein the etchant comprises nitric acid, hydrofluoric acid, saturated iodide, and deionized water.

28. The method of claim 27 wherein the iodide is selected from the group consisting of potassium iodide (KI) and sodium iodide (NaI).

29. The method of claim 23 wherein the etchant comprises nitric acid, hydrofluoric acid, saturated iodine, and deionized water.

30. A method for measuring depths of boundaries, the method comprising:
   using an etchant to selectively etch a p-doped region, a first n-doped region having a first n-dopant concentration, and a second n-doped region having a second n-dopant concentration which is higher than the first n-dopant concentration, to reveal a first boundary between the p-doped region and the first n-doped region, and to reveal a second boundary between the first n-doped region and the second n-doped region, wherein the etch rates are characterized as follows:
   an etch rate of the second n-doped region>
   an etch rate of the first n-doped region>
   an etch rate of the p-doped region; and
   measuring a depth of the first boundary and a depth of the second boundary.

31. The method of claim 30 wherein the depths are measured using a scanning electron microscope.

* * * * *